United States Patent [19]
Izaki

[11] Patent Number: 4,789,877
[45] Date of Patent: Dec. 6, 1988

[54] PRESSING DEVICE
[75] Inventor: Takesi Izaki, Nagoya, Japan
[73] Assignee: Brother Kogyo Kabushiki Kaisha, Japan
[21] Appl. No.: 107,296
[22] Filed: Oct. 9, 1987
[30] Foreign Application Priority Data
   Oct. 9, 1986 [JP] Japan ................. 61-155459
[51] Int. Cl.$^4$ ............................. G03G 15/20
[52] U.S. Cl. ..................... 355/3 FU; 355/3 R; 355/14 FU; 219/216
[58] Field of Search ............. 355/3 FU, 3 SH, 3 R, 355/14 SH, 14 FU; 219/216

[56]         References Cited
       U.S. PATENT DOCUMENTS
   4,419,003  12/1983  Fujie et al. ............ 355/3 SH X
   4,566,778   1/1986  Sasaki ................... 355/3 FU
   4,572,648   2/1986  Toriumi et al. .......... 355/3 FU Primary Examiner—A. C. Prescott
Attorney, Agent, or Firm—Kane, Dalsimer, Sullivan, Kurucz, Levy, Eisele & Richard

[57]             ABSTRACT

A pressing device for pressing a sheet-shaped subject such as a recording sheet on which an image is formed by toners or an optical latent image is formed to be fixed or developed is disclosed.

The disclosed pressing device comprises a pair of pressing rollers, between which the sheet-shaped subject is passed, one of the pressing rollers being arranged such that a rotary axis thereof crosses a feeding direction of the sheet-shaped subject at right angles while the other one of the pressing rollers being arranged such that a rotary axis thereof crosses the rotary axis of the one of the rollers at a certain angle; and means for supporting the other one of the rollers to be moved in the axial direction thereof when it is driven to rotate in contact with the one of the rollers being rotating.

11 Claims, 3 Drawing Sheets

PRESSING DEVICE

BACKGROUND OF THE INVENTION

This invention relates to a device for pressing a sheet-shaped subject, and more particularly to a pressing device for pressing a recording sheet with rollers for use in an optical printer or a copying machine for fixing or developing an image formed thereon.

The prior pressing device of this kind usually comprises a pair of upper and lower pressing rollers, through which a recording sheet passes, and an image formed by toners temporarily adhered on the recording sheet is stably fixed thereon or a latent image formed on a photo and pressure sensitive recording sheet by exposing a corresponding image thereon is developed to a visible one with a pressure applied when passing through the rollers.

Conventionally, as illustrated in FIG. 3, the pair of rollers 1 and 2 are arranged so that the axes thereof cross each other at a certain angle $\theta$ (around 1.5 to 2 degrees). This is because, if the rollers are arranged to be perfectly in parallel with each other, the image on the recording sheet is non-uniformly fixed or developed due to the difference of the surface pressure arised in the direction of axes of the rollers due to the bending of the rollers caused when the recording sheet passes between the pair of rollers. The above non-uniform fixing or development of the image may be prevented by enlarging the diameters of the rollers to increase the rigidity thereof, but results in not only the increase of the weight of the rollers themselves but also the enlargement of the power source required to drive the rollers.

With the above constructed pressing devices, the above non-uniformness of the pressure applied on the recording sheet may be eliminated. However, as also illustrated in FIG. 3, the recording sheet P is tracted in the direction of the arrow E by the lower roller 1 while forced to be tracted in the direction of the arrow F by the upper roller 2 so that the recording sheet P receives tracting forces in the two different directions at the same time when passing through the pair of rollers 1 and 2. In this connection, it has often arised that the recording sheet P was discharged out of the rollers 1 and 2 in a wrinkled state and/or a distorted state.

Further, in case an image is formed on a transferring sheet which is a separate sheet by pressing the recording sheet and the transferring sheet in the state that both sheets are overlapped each other, it has often arised that the image transferred to the transferring sheet was blurred and/or the sheet became dirty due to the slipping between the two sheets.

As disclosed in the U.S. patent specification No. 439,920, there has been proposed to form a visible image by first optically forming a latent image on a recording sheet on which microcapsules enveloping chromogenic materials and photosensitive resins are coated and then transferring the image as a visible one to a transfer sheet on which color-developing agents are coated. More particularly, as illustrated in FIG. 4, the recording sheet 110 coated with a plurality of microcapsules, some s1 of which are softened by exposed to the light while others h1 of which are not-softened as being not exposed to light is pressed by a pair of rollers 110 and 120 together with a transferring sheet 120, on which a layer of color-developing agents 121 is formed. When pressed by the pair of rollers 110 and 120, the softened microcapsules s1 are ruptured and the chromogenic materials enveloped therein are streamed out of the microcapsules s1 and reacted with the color-developing agents 121 to form a color-developed area 121a on the surface of the transferring sheet 120. The not-softened microcapsules h1 are not ruptured so that the corresponding area on the surface of the transferring sheet 120 remains white if the original color of the transferring sheet 120 is white, thus the visible image is formed on the transferring sheet 120. Alternatively, the microcapsules may be hardened by exposed to the light and the unhardened microcapsules may be ruptured by pressed with a pair of rollers to form a visible image.

When pressing these sheets by the above constructed prior pressing device, since the direction of the tracting force applied by the lower roller 1 is different from that of the upper roller 2, the transferring sheet 120 is tracted in the different direction from that of the recording sheet 110, which results in slipping between both sheets 110 and 120 and therefore the image being blurred and/or dirty.

SUMMARY OF THE INVENTION

It is therefore an object of the present invention to provide an improved pressing device capable of fixing and/or developing an image formed on a recording sheet with desirable quality.

For the above purpose, according to the present invention, there is provided a pressing device for pressing a sheet-shaped subject comprising: a pair of pressing rollers, between which said sheet-shaped subject is passed, one of said pressing rollers being arranged such that a rotary axis thereof crosses a feeding direction of said sheet-shaped subject at right angles while the other one of said pressing rollers being arranged such that a rotary axis thereof crosses said rotary axis of said one of the rollers at a certain angle; and means for supporting said other one of the rollers to be moved in a axial direction thereof when it is driven to rotate in contact with said one of the rollers being rotating.

Optionally, the above means for supporting said other one of the rollers may comprise a pair of plummer blocks mounted on a pair of sliders for supporting the both ends of said other one of the rollers and a pair of rails arranged in parallel with each other in the axial direction of said one of the rollers for slidably mounting said pair of sliders thereon.

With the above constructed pressing devices, since the axes of the rollers cross each other at a certain angle, it does not arise the difference of the surface pressure in the direction of axes of the rollers due to the bending of the rollers caused when the sheet-shaped subject passes between the pair of rollers. Further, as the inclined roller driven in contact with the driving roller moves in its axial direction upon the rotation thereof relative to the driving roller, the tractive force actually applied to the sheet-shaped subject by the driven roller meets the feeding direction of the sheet-shaped subject. Thus, the possibility of the sheet-shaped subject being discharged in a wrinkled and/or distorted state is eliminated.

DESCRIPTION OF THE ACCOMPANYING DRAWINGS

DESCRIPTION OF THE PREFERRED EMBODIMENT

Figure 1:
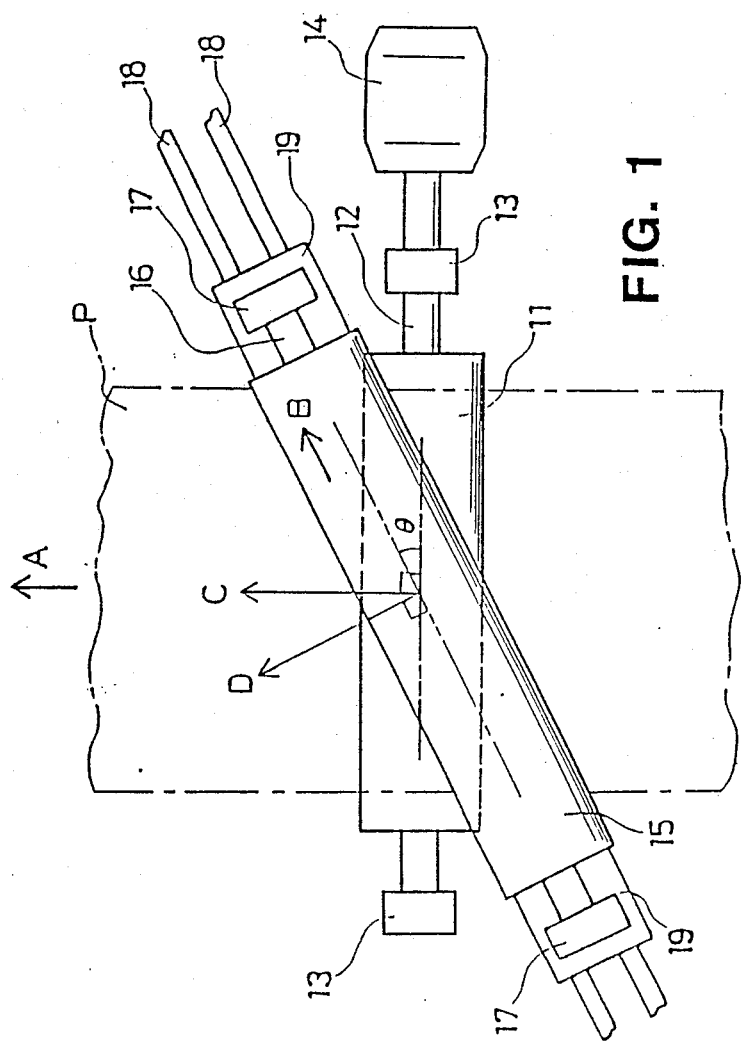
FIG. 1 is a plan view showing a pressing device embodying the invention.
Figure 2:
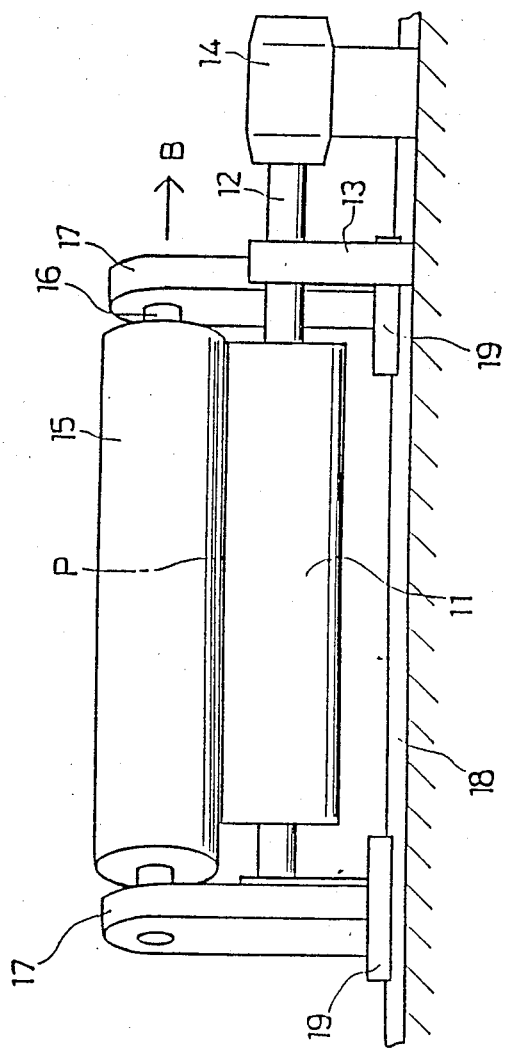
FIG. 2 is a front elevational view showing the pressing device illustrated in FIG. 1.
Figure 3:
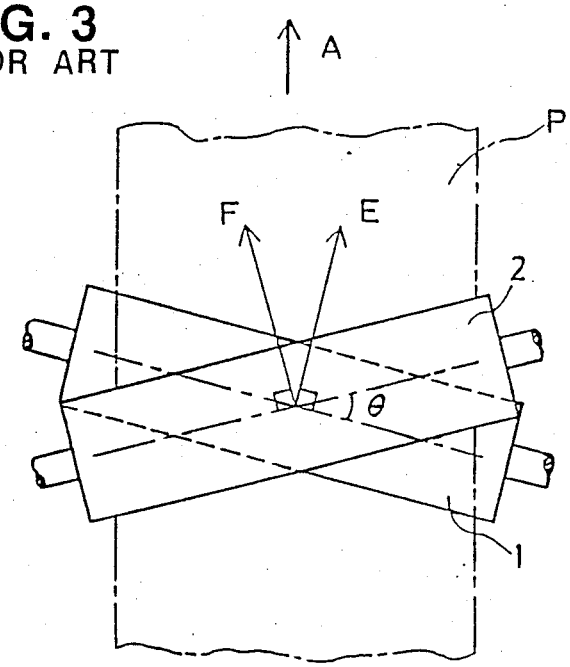
FIG. 3 is a plan view showing a prior art pressing device.

In a pressing device illustrated in FIGS. 1 and 2, a lower roller 11 is arranged such that the axis of the roller 11 crosses a feeding direction of a sheet (indicated by an arrow A) at right angles. The roller 11 is provided with a rotary shaft 12, both ends of which are rotatably and horizontally supported by plummer blocks 13, 13, respectively. One end of the shaft 12 is connected to a motor 14 which drives the roller 11 to rotate.

On the other hand, an upper roller 15 is arranged such that the axis of the roller 15 crosses the axis of the lower roller 11 at a certain horizontal angle $\theta$. The roller 15 is provided with a rotary shaft 16, both ends of which are rotatably and horizontally supported by plummer blocks 17 and 17, respectively. The plummer blocks 17, 17 are planted on sliders 19, 19 which slide on rails 18, 18 extending along the axis of the shaft 16 in parallel with each other.

With the above constructed pressing device, when the lower roller 11 is rotated by the driving force of the motor 11, the upper roller 15 is thereby driven and moved in a direction indicated by an arrow B. Assuming that the amount of the movement of the sheet P is L mm, the amount of the corresponding movement of the upper roller 15 becomes $L \times \sin\theta$ mm. Thus, the tractive force to move the sheet P in a direction (indicated by an arrow D) crossing the rotary shaft 16 of the upper roller 15 is applied by the upper roller 15, but is denied and not actually applied to the sheet P since the the roller 15 itself moves in the direction of the arrow B. Accordingly, the tractive force applied to the sheet P functions to move it in the direction which perfectly meets the feeding direction of the sheet P indicated by the arrow A. This direction of the tractive force also meets the direction of the tractive force (indicated by the arrow C) applied to the sheet P by the lower roller 11. Therefore, no tractive force is applied to the sheet P except the force functions in the feeding direction of the sheet P indicated by the arrow A, so that there arises no wrinkles on the sheet P or distorsions of the fixed or developed image. In the meantime, in order to ensure the above effects, it is desirable to set the crossing angle $\theta$ at not more than 2 degrees.

Figure 4:
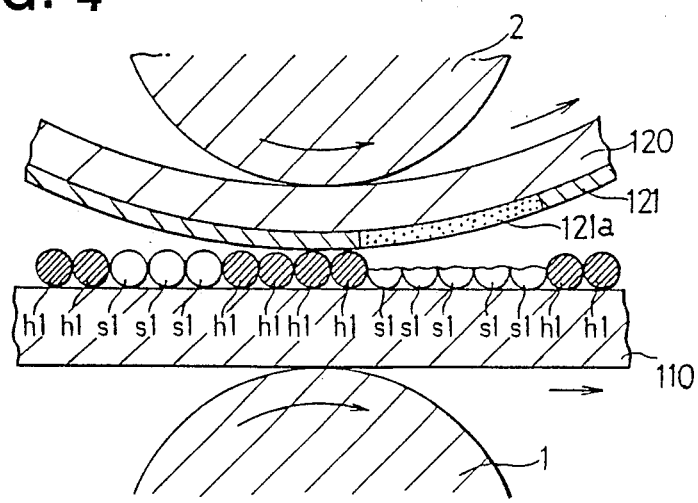
FIG. 4 is an explanatory view showing a recording sheet and a transferring sheet in overlaped state to be pressed by a prior art pressing device.

The above situation is same as in the case the two sheets are introduced between the pair of rollers 11 and 15 for transferring the image from one sheet to the other sheet as explained hereinabove in conjunction with FIG. 4. That is, the tractive force applied to the upper sheet (the transferring sheet 120) by the upper roller 15 functions in the direction of the arrow C as explained above, which is the same direction of the tractive force applied to the lower sheet (the recording sheet 110) by the lower roller 11, so that there does not arise slipping between the overlaped sheets 110 and 120 which may arise if the directions of the tractive forces applied to the sheets by the upper and lower rollers are different from each other.

In the meantime, the amount of the movement of the roller 15 in the direction of the arrow B is around 8 mm provided that an A4 type cut-sheet (210 mm Width×297 mm Length) is longitudinally fed and the crossing angle $\theta$ of the pair of rollers 11 and 15 is 1.6 degree.

Further, in case the sheet P is a cut-sheet, it is desirable to return the roller 15 to its original position by reversely rotating the roller 11 each time the sheet P passed the rollers. Alternatively, a return spring, not illustrated, may be arranged to automatically return the roller to its original position by releasing the contact of the roller 15 with the roller 11. Additionally to the above mentioned, in case the sheet P is a rolled sheet, it is desirable to design the roller 15 to have a relatively long axial length.

As above explained, with the pressing device embodying the invention, without enlarging the diameters of the rollers and/or increasing the power of the roller driving motor, the wrinkles and/or the distorsion of the sheets caused when passed the pair of rollers are prevented.

What is claimed is:

1. A pressing device for pressing a sheet-shaped subject comprising:
   a pair of pressing rollers, between which said sheet-shaped subject is passed, one of said pressing rollers being arranged such that a rotary axis thereof crosses a feeding direction of said sheet-shaped subject at right angles while the other one of said pressing rollers being arranged such that a rotary axis thereof crosses said rotary axis of said one of the rollers at a certain angle; and
   means for supporting said other one of the rollers to be moved in the axial direction thereof when it is driven to rotate in contact with said one of the rollers being rotating.

2. The pressing device according to claim 1 wherein said one of the rollers is horizontally and rotatably supported by a pair of plummer blocks at both ends thereof.

3. The pressing device according to claim 1 wherein said means for supporting said other one of the rollers comprises a pair of plummer blocks for rotatably supporting the both ends of said other one of the rollers, said pair of plummer blocks being mounted on a pair of sliders, and a pair of rails arranged in parallel with each other in the axial direction of said one of the rollers for slidably mounting said pair of sliders thereon.

4. The pressing device according to claim 1 which further comprises a motor connected to one end of said one of the rollers for rotating the same.

5. The pressing device according to claim 1 wherein said crossing angle of the pair of rollers is not more than 2 degrees.

6. A system for producing an image by pressing together a pair of sheet-shaped subjects in overlapped state comprising:
   a pair of pressing rollers, between which said pair of sheet-shaped subjects are passed in overlapped state, one of said pressing rollers being arranged such that a rotary axis thereof crosses a feeding direction of said sheet-shaped subject at right angles while the other one of said pressing rollers being arranged such that a rotary axis thereof crosses said rotary axis of said one of the rollers at a certain angle; and
   means for supporting said other one of the rollers to be moved in the axial direction thereof when it is driven to rotate in contact with said one of the rollers being rotating.

7. The invention according to claim 6 wherein said pair of sheet-shaped subjects comprise a recording sheet on which a latent image is optically formed, and a transferring sheet on which a visible image is formed corresponding to said latent image formed on said recording sheet by being pressed in overlaped state.

8. The invention according to claim 7 wherein said recording sheet comprises a photo and pressure sensitive sheet on which a plurality of microcapsules are coated, said microcapsules enveloping a chromogenic materials and photosensitive materials, and said transferring sheet comprises a sheet on which a color-developing agent is coated, said color-developing agent developing a color when reacted with said chromogenic materials streamed out of said microcapsules when said microcapsules being ruptured.

9. The invention according to claim 6 wherein said one of the rollers is horizontally and rotatably supported by a pair of plummer blocks at both ends thereof, and said means for supporting said other one of the rollers comprises a pair of plmmer blocks for rotatably supporting the both ends of said other one of the rollers, said pair of plummer blocks being mounted on a pair of sliders, and a pair of rails arranged in parallel with each other in the axial direction of said one of the rollers for slidably mounting said pair of sliders thereon.

10. The invention according to claim 9 which further comprises a motor connected to one end of said one of the rollers for rotating the same.

11. The invention according to claim 10 wherein said crossing angle of the pair of rollers is not more than 2 degrees.

* * * * *